United States Patent
Ramachandran et al.

(10) Patent No.: US 9,401,353 B2
(45) Date of Patent: Jul. 26, 2016

(54) INTERPOSER INTEGRATED WITH 3D PASSIVE DEVICES

(71) Applicant: QUALCOMM Incorporated, San Diego, CA (US)

(72) Inventors: Vidhya Ramachandran, Cupertino, CA (US); Shiqun Gu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 105 days.

(21) Appl. No.: 14/454,851

(22) Filed: Aug. 8, 2014

(65) Prior Publication Data
US 2016/0043068 A1  Feb. 11, 2016

(51) Int. Cl.
| | |
|---|---|
| *H01L 27/02* | (2006.01) |
| *H01L 21/48* | (2006.01) |
| *H01L 23/64* | (2006.01) |
| *H01L 23/48* | (2006.01) |
| *H01L 49/02* | (2006.01) |

(52) U.S. Cl.
CPC .......... *H01L 27/0288* (2013.01); *H01L 21/486* (2013.01); *H01L 23/481* (2013.01); *H01L 23/642* (2013.01); *H01L 27/0255* (2013.01); *H01L 28/90* (2013.01); *H01L 2224/16227* (2013.01); *H01L 2924/15311* (2013.01)

(58) Field of Classification Search
CPC . H01L 27/0288; H01L 27/0255; H01L 28/40; H01L 21/486; H01L 23/49827; H01L 23/481; H01L 23/642; H01L 2224/16227; H01L 2924/15311
See application file for complete search history.

(56) References Cited

U.S. PATENT DOCUMENTS

| | | | |
|---|---|---|---|
| 8,171,435 B2 | 5/2012 | He et al. | |
| 2008/0042208 A1 | 2/2008 | Hshieh | |
| 2011/0042795 A1* | 2/2011 | Knickerbocker | ..... H01L 21/486 257/686 |
| 2013/0063843 A1* | 3/2013 | Chen | ..... H01L 23/552 361/56 |
| 2013/0242493 A1 | 9/2013 | Shenoy et al. | |
| 2015/0250058 A1* | 9/2015 | Ramachandran | . H01L 21/28008 361/748 |

FOREIGN PATENT DOCUMENTS

| | | |
|---|---|---|
| WO | 2005088699 A1 | 9/2005 |
| WO | 2013044096 A2 | 3/2013 |
| WO | 2014013078 A1 | 1/2014 |

* cited by examiner

*Primary Examiner* — Roy Potter
(74) *Attorney, Agent, or Firm* — Seyfarth Shaw LLP

(57) ABSTRACT

An integrated interposer includes an interposer substrate including at least a first portion of a 3D passive device within an active region of the interposer substrate. The integrated interposer also includes an inter-conductive dielectric layer on an active surface of the active region of the interposer substrate, the inter-conductive dielectric layer including at least a second portion of the 3D passive device. The integrated interposer further includes a contact layer coupled to the 3D passive devices and configured to couple at least one die to the integrated interposer. The integrated interposer also includes at least one through via coupled to the contact layer and extending through the interposer substrate to a passive surface of the interposer substrate. The integrated interposer further includes an interconnect layer on the passive surface of the interposer substrate and coupled to the at least one through via.

20 Claims, 14 Drawing Sheets

INTERPOSER INTEGRATED WITH 3D PASSIVE DEVICES

BACKGROUND

1. Field

The present disclosure generally relates to integrated circuits (ICs). More specifically, one aspect of the present disclosure relates to embedding 3D passive devices within an integrated interposer.

2. Background

The process flow for semiconductor fabrication of integrated circuits (ICs) may include front-end-of-line (FEOL), middle of line (MOL), and back-end-of-line (BEOL) processes. The FEOL process may include wafer preparation, isolation, well formation, gate patterning, spacer, extension and source/drain implantation, silicide formation, and dual stress liner formation. The MOL process may include gate contact formation. Middle of line layers may include, but are not limited to, MOL contacts, vias or other layers within close proximity to the semiconductor device transistors or other like active devices. The BEOL processes may include a series of wafer processing steps for interconnecting the semiconductor devices created during the FEOL and MOL processes. Successful fabrication of modern semiconductor chip products involves an interplay between the materials and the processes employed.

Various challenges arise when designing an advanced node at or below, for example, sixteen (16) nanometers. For example, reducing die size is important for containing cost while improving yield due to the advanced node scaling. Passives and input/output (I/O) devices may take up significant space on the die of a system on chip (SoC). Although the passives and I/O devices increase the die size, these devices may not involve advanced node processing, and thus become a source of added cost and complexity. For example, at ten (10) nanometers, suppliers are debating whether to include 1.8 volt (V) I/O devices in their technology offerings. Unfortunately, many I/O technologies continue to operate at 1.8 V.

SUMMARY

An integrated interposer includes an interposer substrate having at least a first portion of a 3D passive device within an active region of the interposer substrate. The integrated interposer also includes an inter-conductive dielectric layer on an active surface of the active region of the interposer substrate, the inter-conductive dielectric layer including at least a second portion of the 3D passive device. The integrated interposer further includes a contact layer coupled to the 3D passive devices and configured to couple at least one die to the integrated interposer. The integrated interposer also includes at least one through via coupled to the contact layer and extending through the interposer substrate to a passive surface of the interposer substrate. The integrated interposer further includes an interconnect layer on the passive surface of the interposer substrate and coupled to the at least one through via.

An integrated interposer includes an interposer substrate including at least a first portion of a 3D passive device within an active region of the interposer substrate. The integrated interposer also includes an inter-conductive dielectric layer on an active surface of the active region of the interposer substrate, the inter-conductive dielectric layer including at least a second portion of the 3D passive device. The integrated interposer further includes a contact layer coupled to the 3D passive devices and configured to couple at least one die to the integrated interposer. The integrated interposer also includes an interconnect layer on a passive surface of the interposer substrate. The integrated interposer further includes means for coupling the contact layer through the interposer substrate to the interconnect layer on the passive surface of the interposer substrate.

A method of fabricating an integrated interposer includes depositing an inter-conductive dielectric layer on an interposer substrate and fabricating at least a first portion of a 3D passive device within an active region of the interposer substrate. The method also includes fabricating at least a second portion of the 3D passive device within the inter-conductive dielectric layer on an active surface of the active region of the interposer substrate. The method further includes opening a contact layer to the first portion of the 3D passive device within the active region of the interposer substrate and to the second portion of the 3D passive device within the inter-conductive dielectric layer on the active surface of the interposer substrate. The method also includes depositing a conductive material in at least one opening in the contact layer and at least one via opening on the active surface of the interposer substrate and extending through the interposer substrate to a passive surface of the interposer substrate to couple at least one die to the integrated interposer. The method also includes forming an interconnect layer on the passive surface of the interposer substrate and coupled to the contact layer through the conductive material in the least one via opening.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
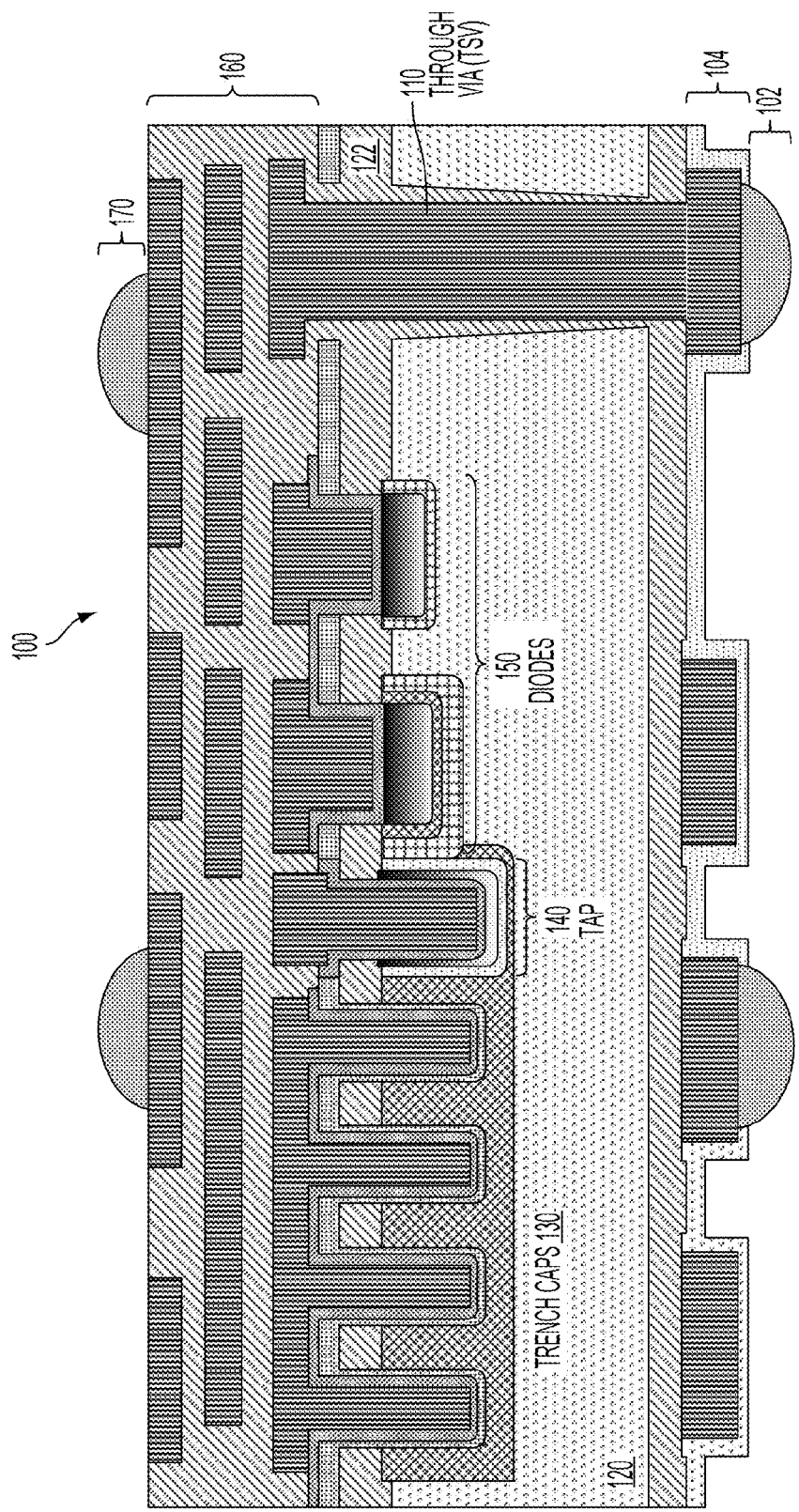
FIG. 1 shows a cross-sectional view illustrating an integrated interposer including 3D passive devices within an interposer substrate according to one aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Some described implementations relate to interposer technology. An interposer generally serves as an intermediate layer that can be used for direct electrical interconnection between one device or substrate and a second device or substrate with the interposer positioned in between. For example, an interposer may have a pad configuration on one side that can be aligned with corresponding pads on a first device, and a different pad configuration on a second side that corresponds to pads on a second device. The interposer can contain electrical traces that allow interconnecting pads to be aligned and mated to devices on opposite sides. In some implementations, the interposer includes an interposer layer that has electrically conductive interconnects (vias) extending through the layer. For example, in one configuration, the interposer layer can include a glass substrate having a through glass via. In another configuration, the substrate interposer includes a predrilled via opening. The interposer can further include one or more routing or redistribution layers. In one aspect of the present disclosure, one or more thin film active devices are embedded within an integrated interposer. In some configuration, the device(s) may be attached to each side of the integrated interposer.

Various aspects of the disclosure provide techniques for embedding 3D passive devices within an integrated interposer. The process flow for semiconductor fabrication of an integrated interposer may include front-end-of-line (FEOL) processes, middle of line (MOL) processes, and back-end-of-line (BEOL) processes. It will be understood that the term "layer" includes film and is not to be construed as indicating a vertical or horizontal thickness unless otherwise stated. As described herein, the term "semiconductor substrate" or "interposer substrate" may refer to a substrate of a diced wafer or may refer to the substrate of a wafer that is not diced. Similarly, the terms wafer and die may be used interchangeably unless such interchanging would tax credulity.

According to one aspect of the disclosure, an integrated interposer with an interposer substrate includes embedded 3D passive devices. The 3D passive devices may be fabricated by selectively doping an interposer substrate to form one or more active regions. By placing 3D passive devices within the interposer, removal of ESD (electrostatic discharge) protection and other passive devices from an active die becomes possible. This configuration enables the combination of an active die for providing targeted (e.g., high performance) technologies for each system functionality (processor, modem, memory, etc.), while the integrated interposer provides other functionality (e.g., die interconnection, system ESD protection, embedded passives, etc.)

FIG. 1 show a cross-sectional view illustrating an integrated interposer 100 including 3D passive devices within an interposer substrate 120 according to one aspect of the disclosure. Representatively, the integrated interposer 100 includes an interposer substrate (e.g., a semiconductor or silicon wafer) 120 having a first portion of 3D passive devices (e.g. trench capacitor structure 130, the substrate tap 140 and diodes 150). An inter-conductive dielectric layer 122 (e.g., an inter-metal dielectric (IMD)) is disposed on the interposer substrate 120. In this configuration, the inter-conductive dielectric layer 122 includes a second portion of the 3D passive devices that are, for example, above the interposer substrate 120.

Figure 12:
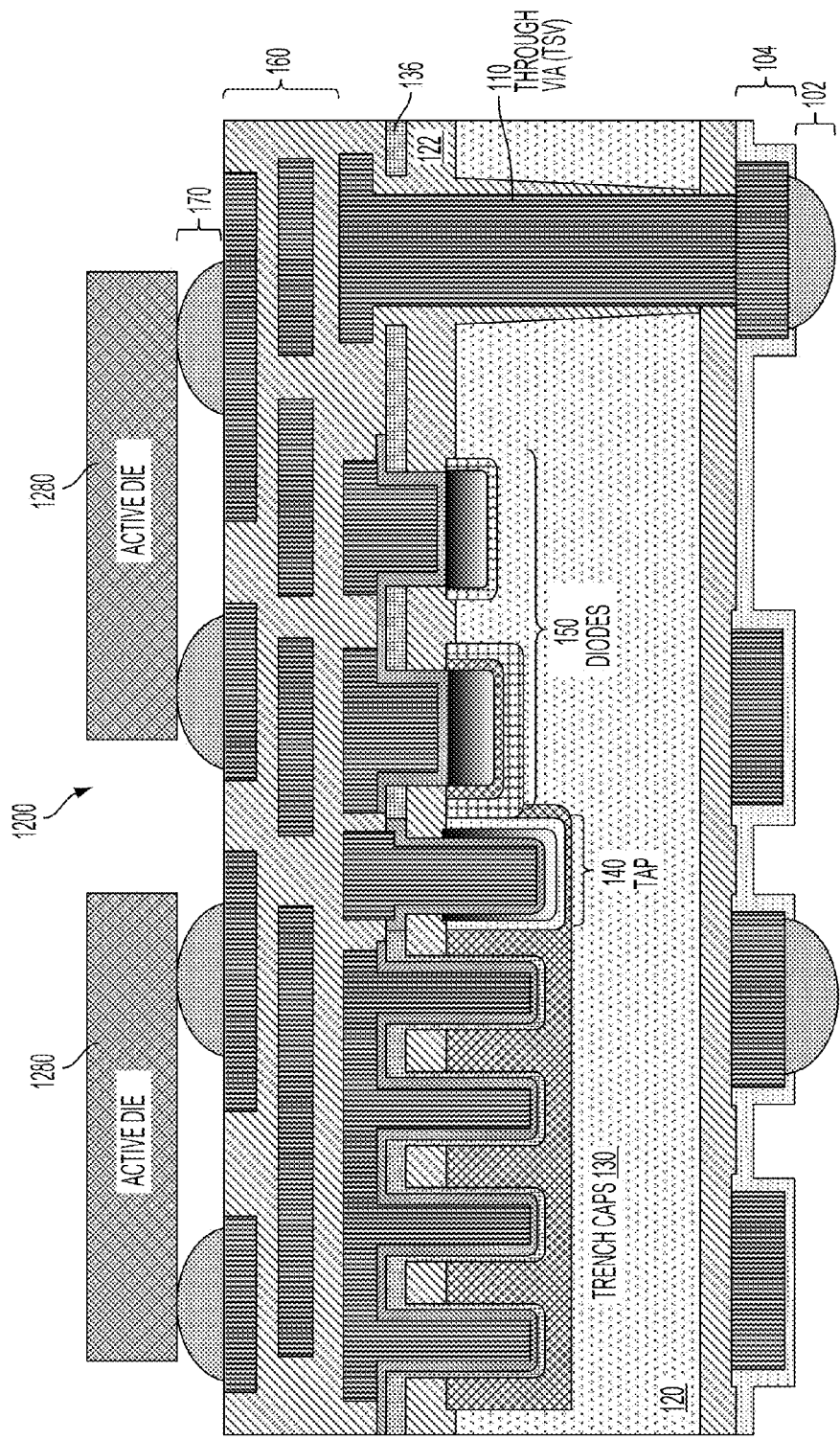
FIG. 12 shows a cross-sectional view of a system on chip including the integrated interposer of FIG. 1 according to one aspect of the disclosure.

In this configuration, a contact layer 160 to the 3D passive devices is formed on the inter-conductive dielectric layer 122. The contact layer 160 is coupled to a redistribution layer 104 by a through via 110. A first set of interconnects within a first interconnect layer 102 may couple a system board (not shown) to the integrated interposer 100. In addition, active die (not shown) may be coupled to the integrated interposer 100 through a second set of interconnects within a second interconnect layer 170 to form a system on chip, for example, as shown in FIG. 12.

Figure 2:
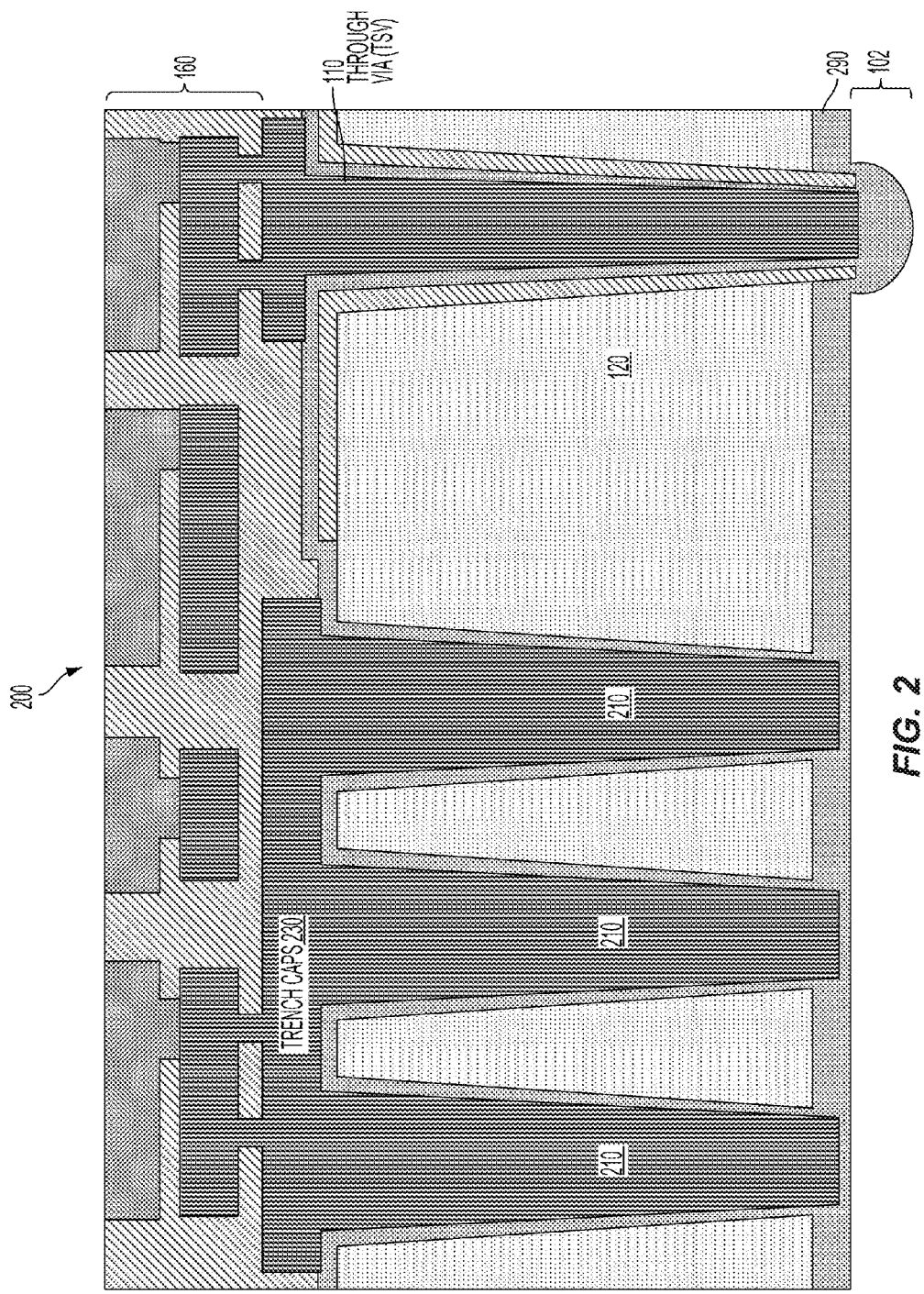
FIG. 2 shows a cross-sectional view illustrating an integrated interposer including vias configured as plates of a 3D trench capacitor according to one aspect of the disclosure.

FIG. 2 shows a cross-sectional view illustrating an integrated interposer 200 including vias configured as plates of a 3D trench capacitor according to one aspect of the disclosure. In this arrangement, a trench capacitor 230 is formed using trench vias 210 as the capacitor electrodes of the trench capacitor 230. In contrast to the through via 110, the trench vias 210 do not extend through an isolation layer 290. The trench vias 210 and the through via 110 are coupled to the contact layer 160; however, only the through via 110 is coupled to the first interconnect layer 102. Although shown as including only the trench capacitor 230, it should be recognized that other 3D passive devices may be embedded within the interposer substrate 120.

Figure 3:
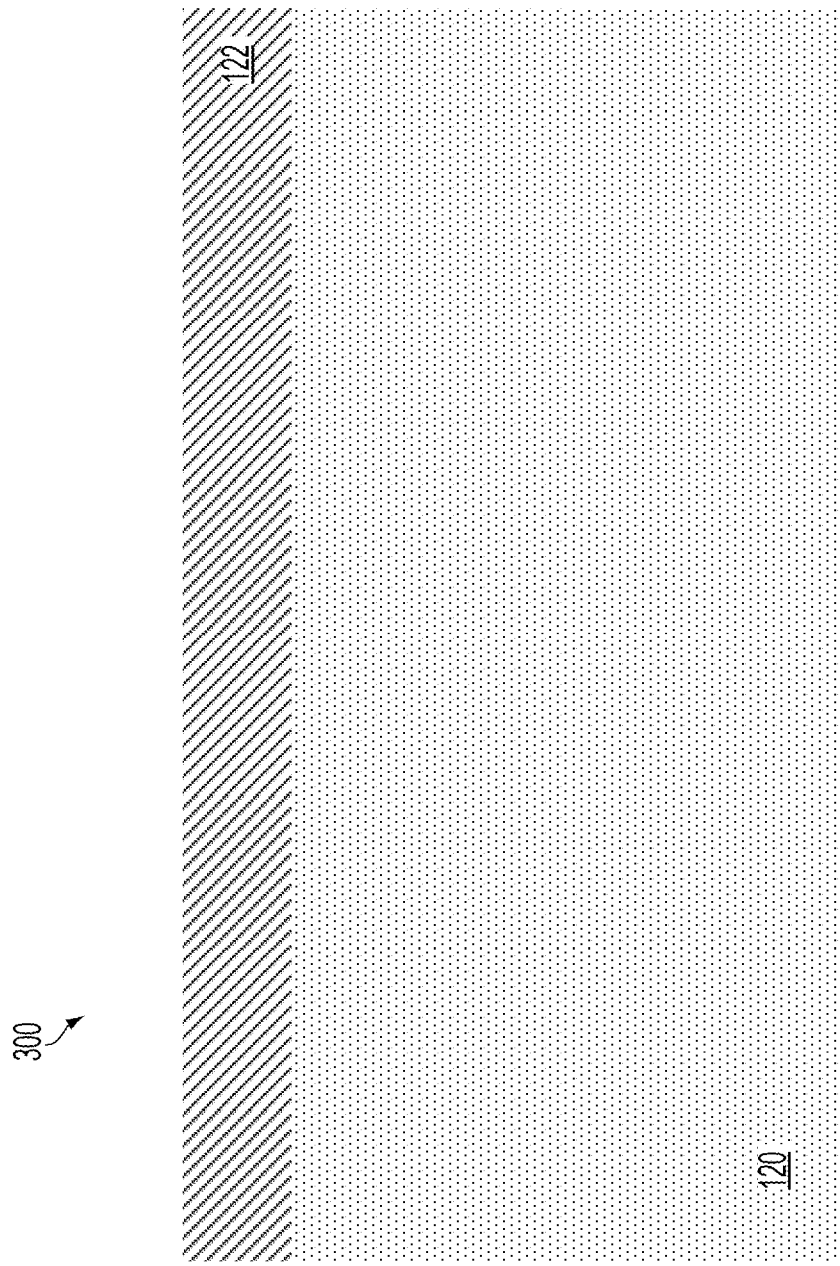
FIG. 3 shows a cross-sectional view illustrating an interposer substrate including an inter-conductive dielectric layer according to one aspect of the disclosure.

A process for fabricating the integrated interposer 100 of FIG. 1, according to one aspect of the disclosure, is illustrated in FIGS. 3 to 11. FIG. 3 shows a cross-sectional view 300 illustrating the interposer substrate 120 including an inter-conductive dielectric layer 122 according to one aspect of the disclosure. In this arrangement, the interposer substrate 120 is a p-type interposer substrate to enable subsequent formation of 3D passive devices.

Figure 4:
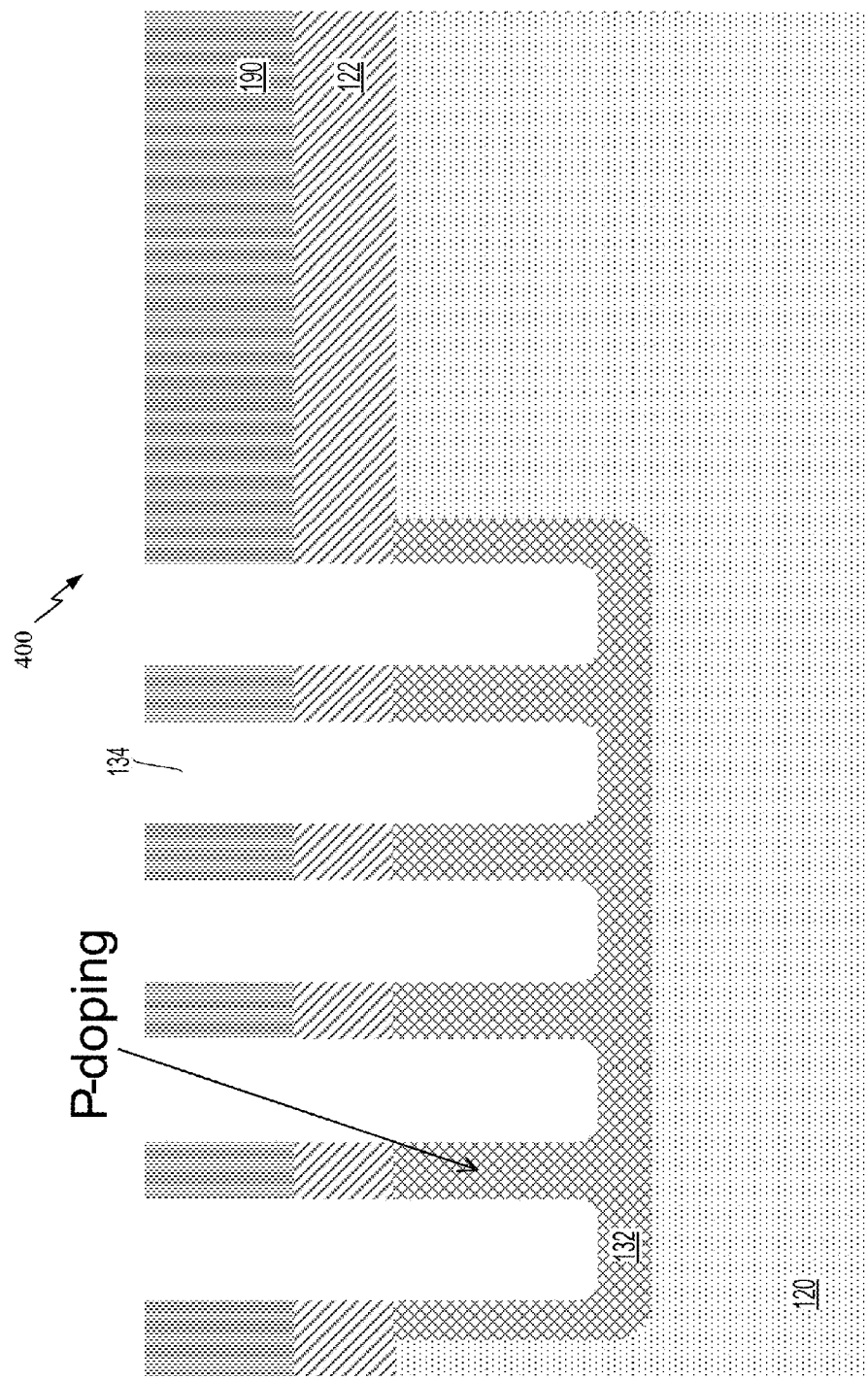
FIG. 4 shows a cross-sectional view illustrating the interposer substrate of FIG. 3 after capacitor trench etching and doping to form an active region according to one aspect of the disclosure.

FIG. 4 shows a cross-sectional view 400 illustrating the interposer substrate 120 of FIG. 3 after capacitor trench etching and doping to form a capacitor active region 132 according to one aspect of the disclosure. In this arrangement, a trench mask 190 is deposited on the inter-conductive dielectric layer 122. Following deposition of the trench mask 190, an etching process is performed to form capacitor trenches 134. Once formed, a chained p-implant is performed through a trench mask implant. This p-implant forms the capacitor active region 132 of the interposer substrate 120. In contrast to other active regions of the interposer substrate 120 (e.g., a diode active region), the p-implant chain into the active region is at a greater depth as well as a greater density.

Figure 5:
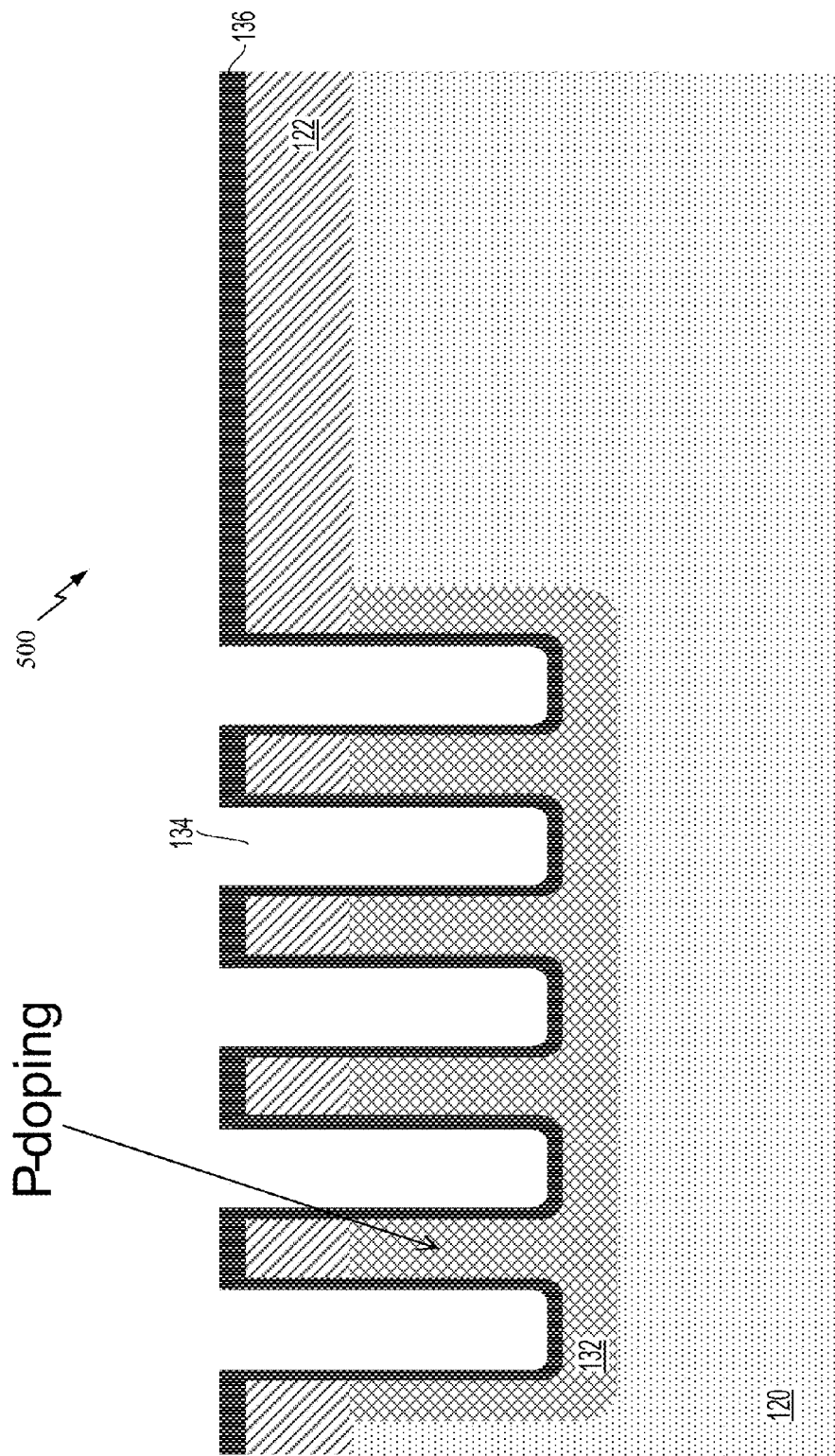
FIG. 5 shows a cross-sectional view illustrating the interposer substrate of FIG. 4 after deposition of a dielectric layer according to one aspect of the disclosure.

FIG. 5 shows a cross-sectional view 500 illustrating the interposer substrate 120 of FIG. 4 after deposition of a capacitor dielectric layer 136 according to one aspect of the disclosure. The interposer substrate 120 is shown following a strip resist process to remove the trench mask 190. Once removed, the capacitor dielectric layer 136 is depositing on the inter-conductive dielectric layer 122 and the capacitor trenches 134.

Figure 6:
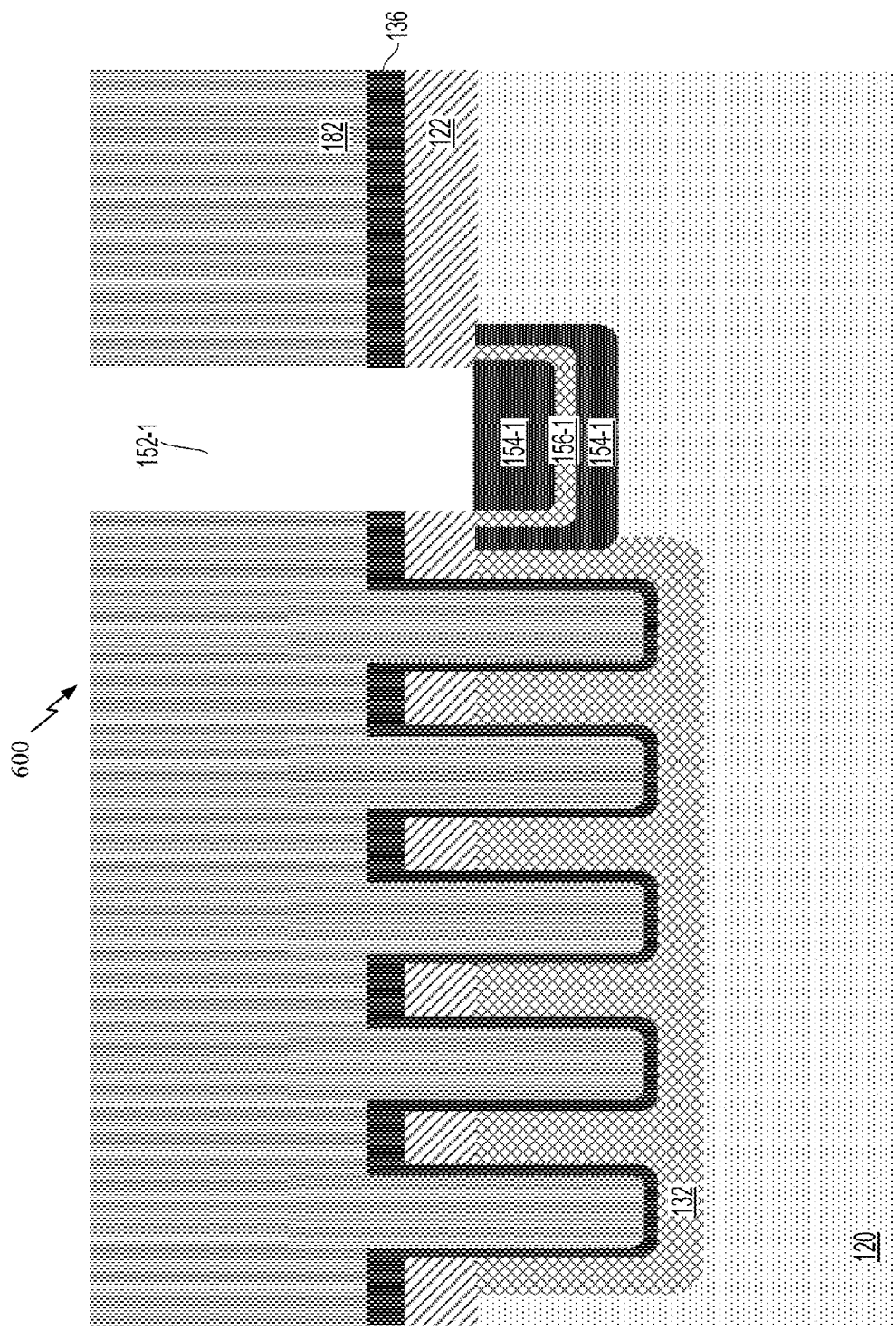
FIG. 6 shows a cross-sectional view of the interposer substrate of FIG. 5 after etching and doping of a first diode region according to one aspect of the disclosure.

FIG. 6 shows a cross-sectional view 600 of the interposer substrate 120 of FIG. 5 after etching and doping of a first diode region according to one aspect of the disclosure. A photoresist 182 may be initially deposited on the capacitor dielectric layer 136 using, for example, a lithographic process. Once deposited, an etch of the capacitor dielectric layer 136 and the inter-conductive dielectric layer 122 is performed to form a first diode region opening 152-1. Once opened, an implant process forms an n-type region 154-1, a p-type region 156-1 and an n-type region 154-1 within the first diode region opening 152-1. The photoresist 182 is subsequently used to fill the first diode region opening 152-1.

Figure 7:
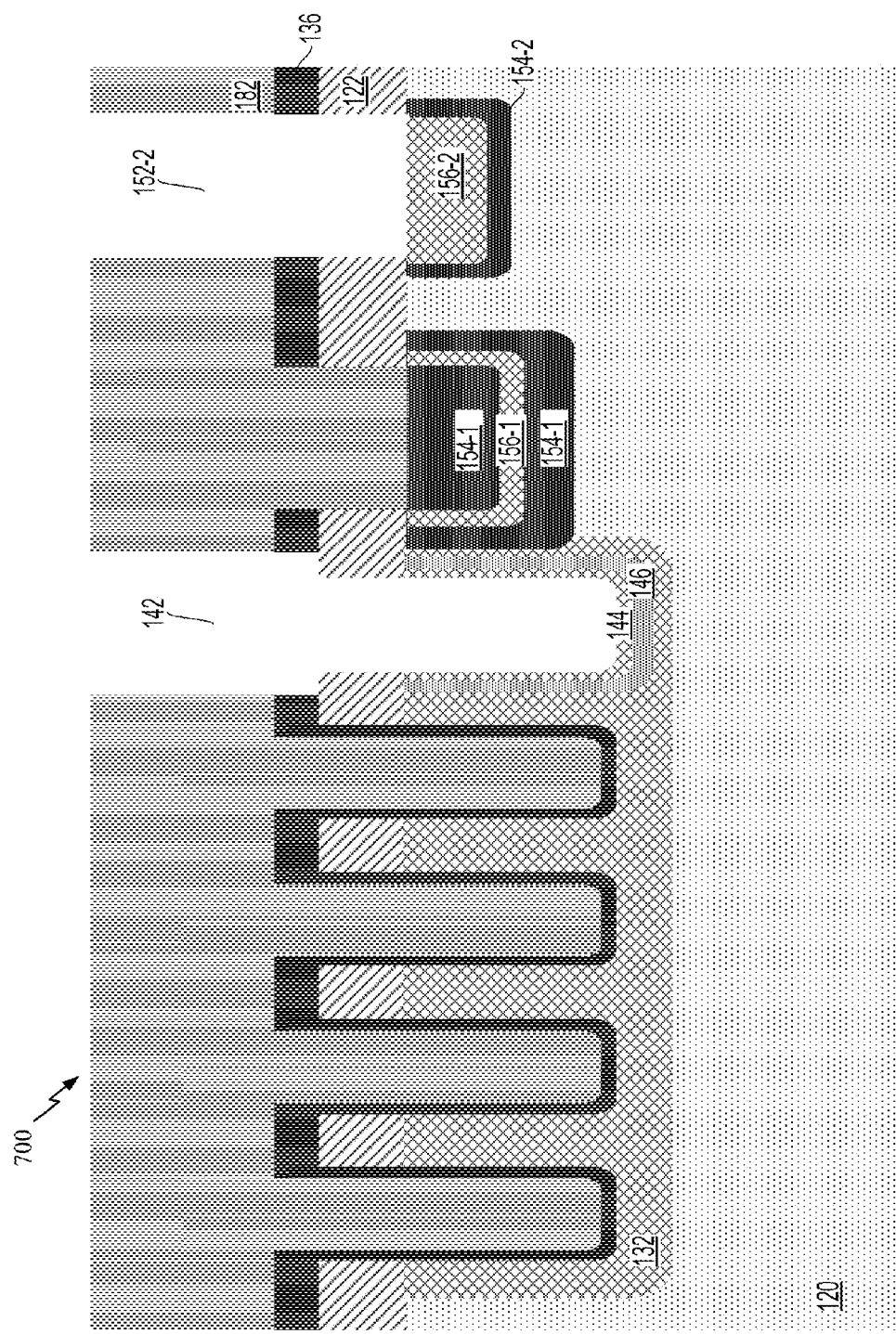
FIG. 7 shows a cross-sectional view of the interposer substrate of FIG. 6 after etching and doping of a substrate contact and a second diode region according to one aspect of the disclosure.

FIG. 7 shows a cross-sectional view 700 of the interposer substrate 120 of FIG. 6 after etching and doping of a substrate contact and a second diode region according to one aspect of the disclosure. In this configuration, a single lithographic step forms a substrate tap trench 142. The single lithographic step also concurrently forms a second diode region opening 152-2. Similar to FIG. 6, a single lithographic etch of the capacitor dielectric layer 136 and the inter-conductive dielectric layer 122 forms the first diode region opening 152-2. In addition, formation of a substrate tap trench 142 is performed using, for example, a selective dielectric etch to remove the capacitor dielectric layer 136 and the inter-conductive dielectric layer 122. In this arrangement, the selective dielectric etch also removes the capacitor dielectric layer 136 from sidewalls and an adjacent surface of the substrate tap trench 142.

In this configuration, a P-type and N-type (P-N) profile implant is performed within the substrate tap trench 142 and the second diode region opening 152-2. Based on the P-N profile implant, an n-type region 154-2 and a p-type region 156-2 of the second diode region are formed. The P-N profile implant into the substrate tap trench 142 provides a p-doped region 144 and an n-doped region 146 of the substrate tap 140. The N-doping into the substrate tap trench 142 is lower than the p-doping forming the capacitor active region 132 of the interposer substrate 120. As a result, the substrate tap trench 142 remains in a p-type state. In this configuration, the substrate tap 140 enables access to the capacitor active region 132 of the interposer substrate 120.

Figure 8:
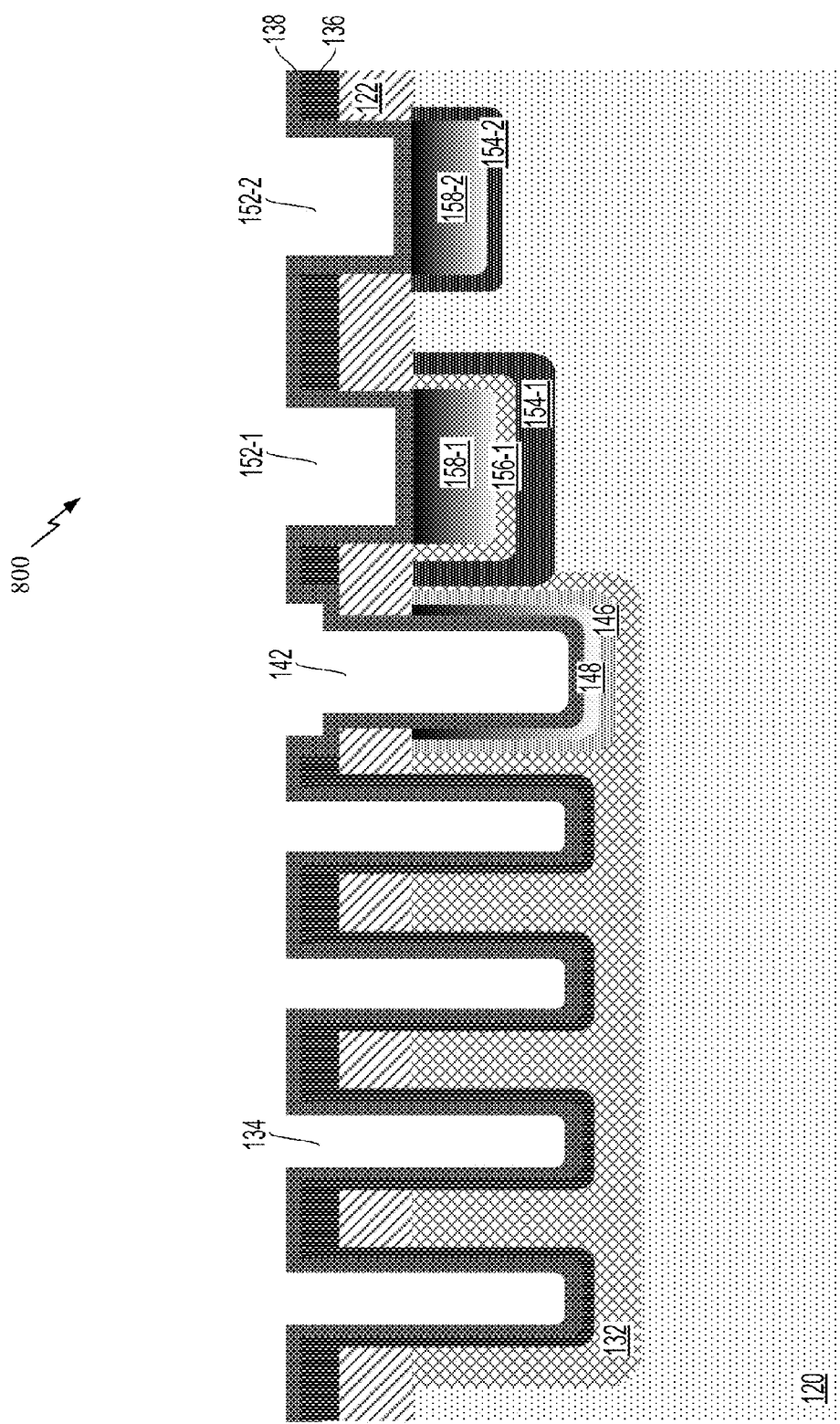
FIG. 8 shows a cross-sectional view of the interposer substrate of FIG. 7 after deposition of a conductive liner material according to one aspect of the disclosure.

FIG. 8 shows a cross-sectional view 800 of the interposer substrate 120 of FIG. 7 after deposition of a conductive liner material 138 according to one aspect of the disclosure. Following stripping of the photoresist 182, the conductive liner material 138 is deposited on the capacitor dielectric layer 136 and within the substrate tap trench 142, the first diode region opening 152-1 and the second diode region opening 152-2 (e.g., the sidewalls and adjacent surfaces). In one configuration, a siliciding conductive (e.g., metal) deposition deposits the conductive liner material 138 on the capacitor dielectric layer 136 and lines the substrate tap trench 142, the first diode region opening 152-1 and the second diode region opening 152-2. An anneal process may be performed within the substrate tap trench 142, the first diode region opening 152-1 and the second diode region opening 152-2. This anneal process causes the formation of a silicide region 148 within the substrate tap 140, a silicide region 158-1 within first diode region opening 152-1, and a silicide region 158-2 within the second diode region opening 152-2. In this configuration, no silicide is formed within the capacitor trenches 134. The conductive liner material 138 may be nickel, titanium, cobalt or other like conductive material.

Figure 9:
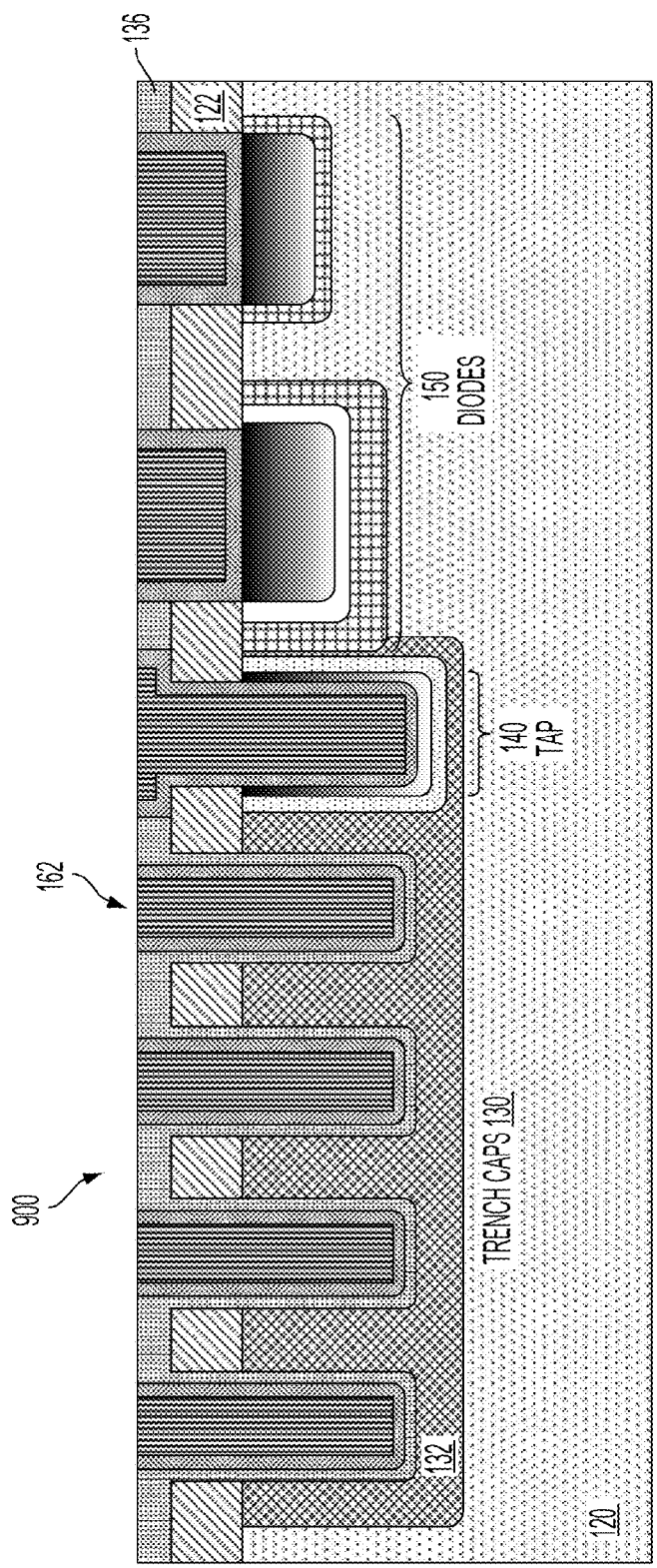
FIG. 9 shows a cross-sectional view illustrating the interposer substrate of FIG. 8 after middle of line metallization according to one aspect of the disclosure.

FIG. 9 shows a cross-sectional view 900 illustrating the interposer substrate of FIG. 8 after middle of line metallization according to one aspect of the disclosure. In this arrangement, the interposer substrate 120 is shown after deposition of a conductive material 162. The conductive material 162 may be a middle of line (MOL) conductive layer (e.g., metal zero (M0)). In one configuration, a damascene process deposits the conductive material 162 within the capacitor trenches 134, the substrate tap trench 142, the first diode region opening 152-1 and the second diode region opening 152-2. A damascene chemical mechanical polish (CMP) may tailor a thickness of the capacitor dielectric layer 136 to adjust a capacitance of the 3D trench capacitor structure 130. In this arrangement, the 3D trench capacitor structure 130 provides one example for integrating a high density, metal-insulator-metal (MIM) capacitor within the integrated interposer 100. In addition, an inductor may be formed within the MOL conductive layer.

In one configuration, the MOL conductive layer provides a shield to cover the interposer substrate 120 in selected regions. The MOL conductive layer may be arranged as a selective, ground-able conductive shield over the interposer substrate 120 to assist with the passage of high speed signals. Although the conductive material 162 is described as deposited using the damascene process, it should be recognized that the conductive material 162 may deposited using a semi-additive process (SAP) or other like process.

Figure 10:
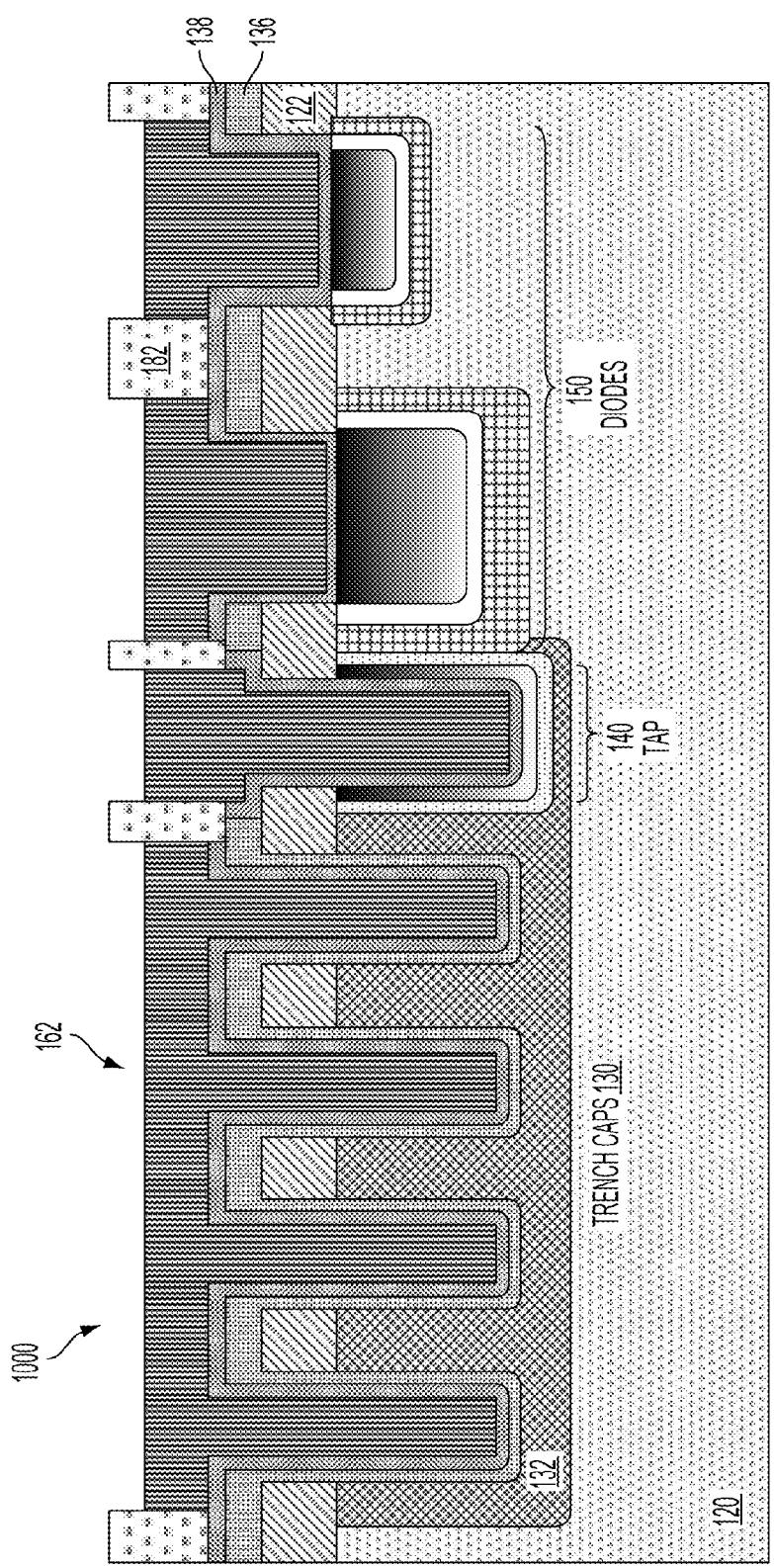
FIG. 10 shows a cross-sectional view illustrating the interposer substrate of FIG. 9 after additional middle of line metallization according to one aspect of the disclosure.

FIG. 10 shows a cross-sectional view 1000 illustrating the interposer substrate 120 of FIG. 9 after additional middle of line metallization according to one aspect of the disclosure. In this configuration, the photoresist 182 is deposited on regions of the integrated interposer between the trench capacitor structure 130, the substrate tap 140, and the diodes 150. The deposition of the conductive material 162 may be performed using a damascene process, a semi-additive process (SAP), or other like process.

Figure 11:
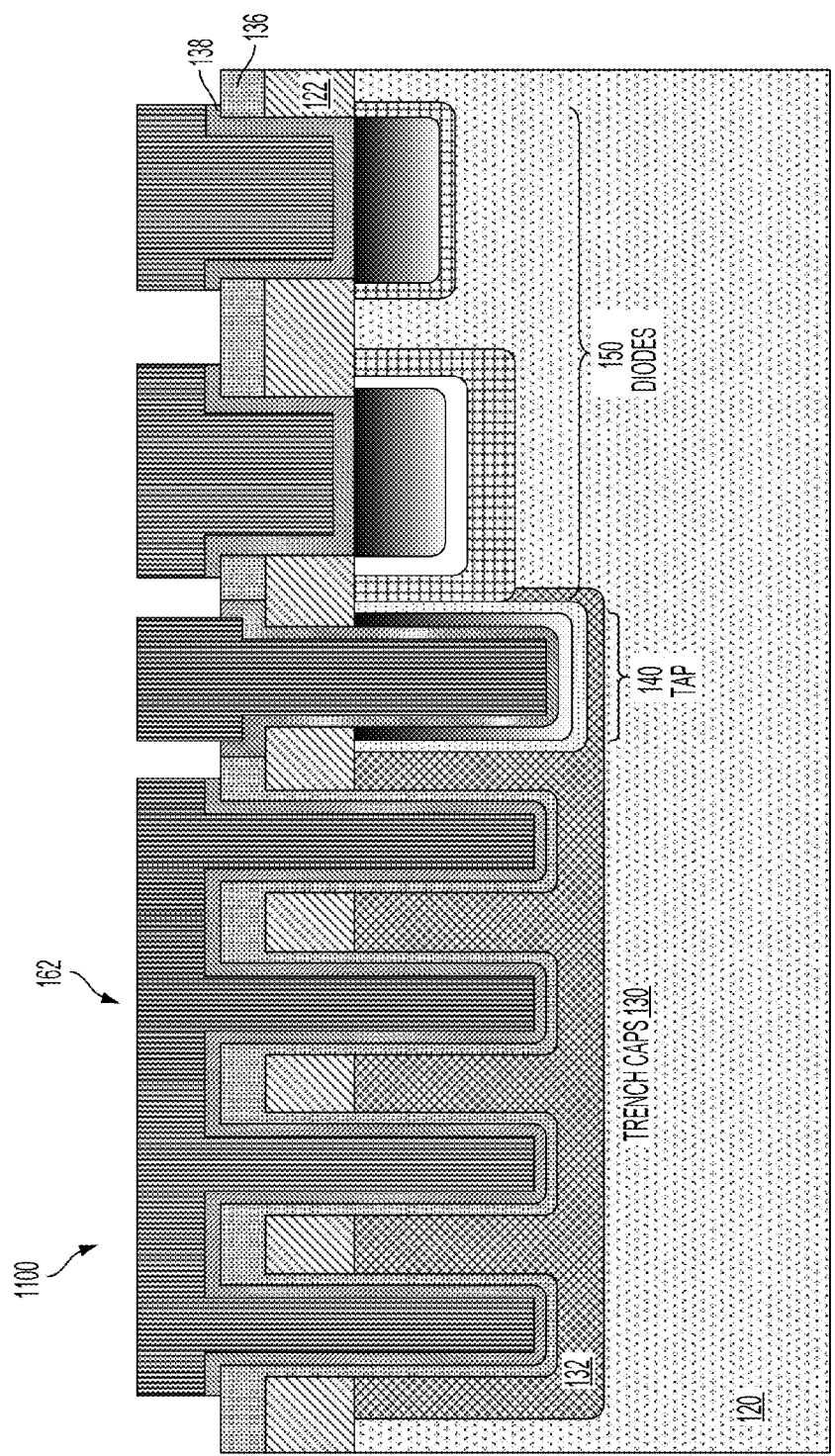
FIG. 11 shows a cross-sectional view illustrating the interposer substrate of FIG. 10 after under bump metallization according to one aspect of the disclosure.

FIG. 11 shows a cross-sectional view 1100 illustrating the interposer substrate 120 of FIG. 10 after under bump metallization according to one aspect of the disclosure. The photoresist 182 is stripped and under bump metallization (not shown) is deposited where the photoresist 182 was. In this configuration, the trench capacitor structure 130 and the substrate tap 140 include a first portion within the capacitor active region 132 of the interposer substrate 120 and a second portion within the inter-conductive dielectric layer 122. In this arrangement, the substrate tap enable access to a first plate of the trench capacitor structure 130 and a contact layer (see FIG. 12) enable access to a second plate of the trench capacitor structure 130.

FIG. 12 shows a cross-sectional view of a system on chip (SoC) 1200 including the integrated interposer 100 of FIG. 1 according to one aspect of the disclosure. In this configuration, the integrated interposer 100 is shown after completion of the contact layer 160 and the redistribution layer 104. The contact layer 160 is coupled to the redistribution layer 104 through the TSV 110. A first set of interconnects of the first interconnect layer 102 may couple a system board (not shown) to the integrated interposer 510. In addition, active die 1280 (1280-1, 1280-2) are coupled to the integrated interposer 100 through a second set of interconnects of the second interconnect layer 170. The SoC 1200 may include an over molding (not shown) on the active die 1280. It should be recognized that the TSV 110 may be patterned before or after the MOL interconnect layer metallization. In addition, filling of the TSV 110 with the conductive material 162 (e.g., copper (Cu) or tungsten (W)) may be performed concurrently with the MOL interconnect layer metallization shown in FIGS. 9 and 10.

Figure 13:
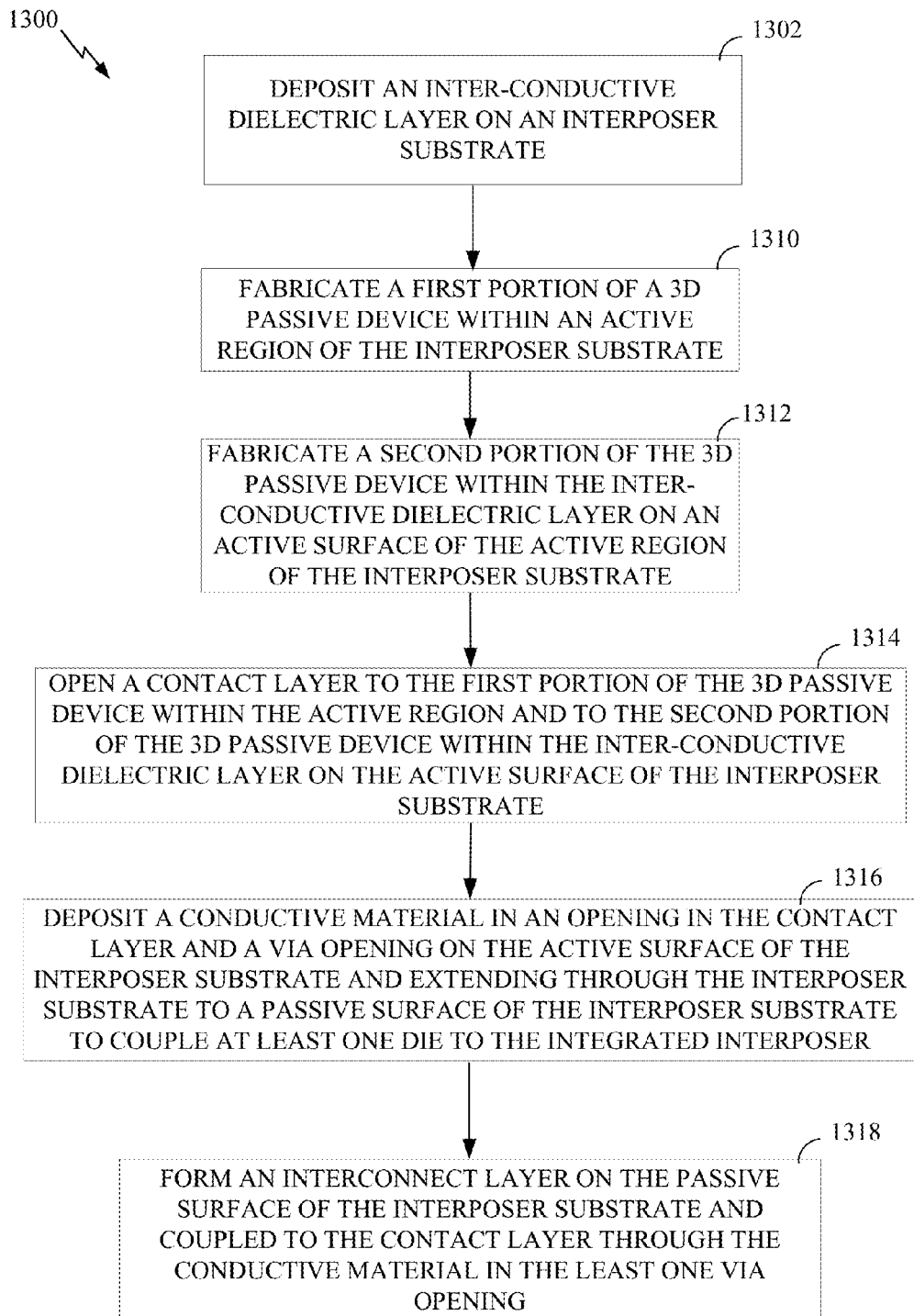
FIG. 13 is a block diagram illustrating a method for fabricating the integrated interposer according to one aspect of the disclosure.

FIG. 13 is a block diagram illustrating a method 1300 for fabricating an integrated interposer according to one aspect of the disclosure. At block 1302, an inter-conductive dielectric layer is deposited on an active surface of an active region of an interposer substrate. For example, as shown in FIG. 3, the inter-conductive dielectric layer 122 is deposited on the interposer substrate 120. At block 1310, a first portion of a 3D passive device is fabricated within an active region of the interposer substrate. Although the present description has mentioned silicon interposer substrates, other substrate materials including glass, sapphire or other like materials are also contemplated. At block 1312, a second portion of the 3D passive device is fabricated within the inter-conductive dielectric layer on an active surface of the active region of the interposer substrate, for example, as shown in FIGS. 4 to 8. At block 1314, a contact layer is opened to the first portion of the 3D passive device within the active region of the interposer substrate and to the second portion of the 3D passive device within the inter-conductive dielectric layer on the active surface of the interposer substrate, for example, as shown in FIG. 9.

Referring again to FIG. 13, at block 1316, a conductive material is deposited in the opening in the contact layer and a via opening on the active surface of the interposer substrate and extending through the interposer substrate to a passive surface of the interposer, as shown in FIGS. 10 and 11. In this configuration, the contact layer enables coupling of a die to the integrated interposer through one or more interconnects, for example, as shown in FIG. 12. At block 1318, an interconnect layer is formed on the passive surface of the interposer substrate and coupled to the contact layer through the conductive material in the via opening. For example, as shown in FIG. 12, the through via 110 couples the redistribution layer 104 to the contact layer 160. In this configuration, active die 1280 are coupled to the integrated interposer 100 through a second set of interconnects of the second interconnect layer 170. In addition, a first set of interconnects of the first interconnect layer 102 may couple a system board to the integrated interposer 100 through the redistribution layer 104.

Although the present description has mentioned a copper filler, other filler materials are also contemplated. As shown in FIGS. 1 and 12, an optional redistribution layer (RDL) process can be performed to couple a system board to the integrated interposer 100 through a redistribution layer. In other configurations, the redistribution layer 104 may couple the board to the integrated interposer 100 through the interconnects of the first interconnect layer 102.

In one configuration, an integrated interposer includes a first portion of a 3D passive device within an active region of an interposer substrate. The integrated interposer includes a means for coupling the contact layer through the interposer substrate to the interconnect layer on the passive surface of the interposer substrate. In one aspect of the disclosure, the coupling means is the through via 110 of FIGS. 1 and/or 12, configured to perform the functions recited by the coupling means. In another aspect, the aforementioned means may be a device or any layer configured to perform the functions recited by the aforementioned means.

Figure 14:
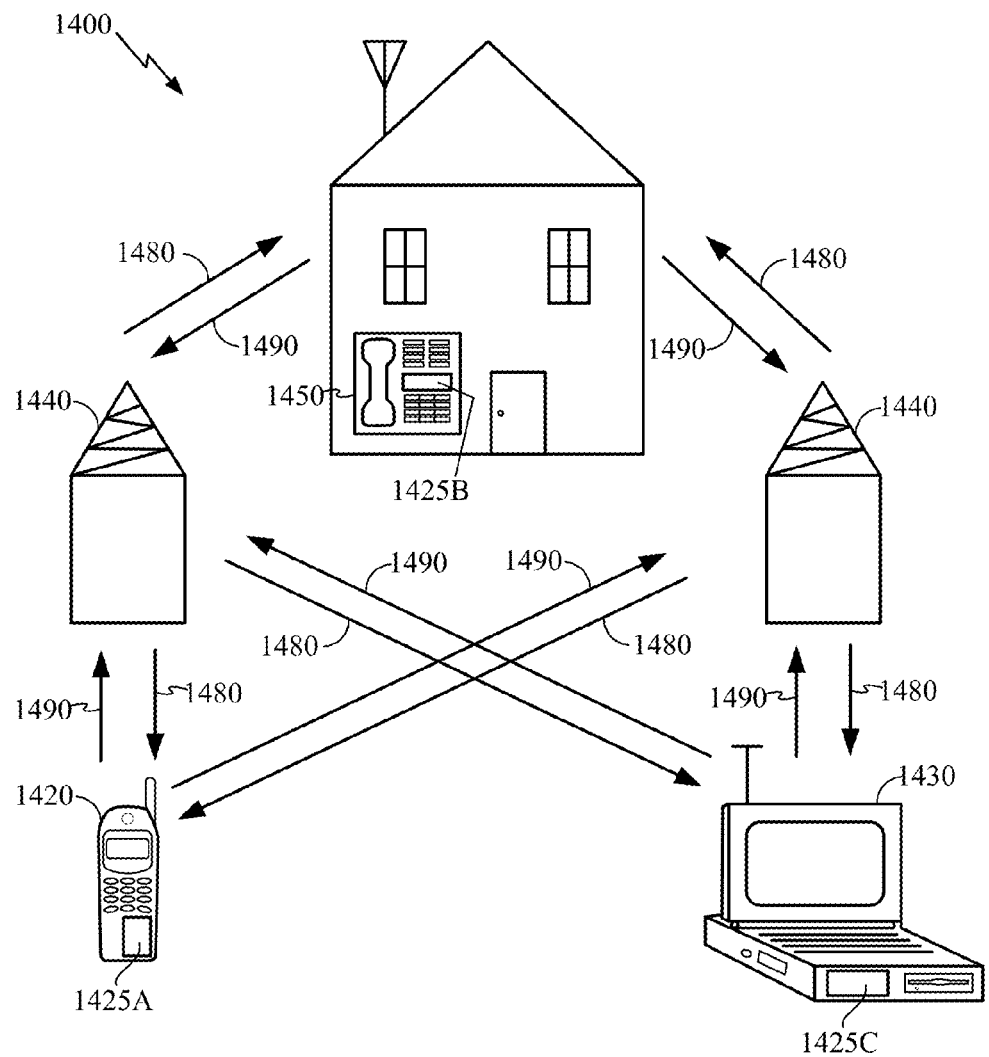
FIG. 14 is a block diagram showing a wireless communication system in which a configuration of the disclosure may be advantageously employed.

FIG. 14 is a block diagram showing an exemplary wireless communication system 1400 in which a configuration of the disclosure may be advantageously employed. For purposes of illustration, FIG. 14 shows three remote units 1420, 1430, and 1450 and two base stations 1440. It will be recognized that wireless communication systems may have many more remote units and base stations. Remote units 1420, 1430, and 1450 include IC devices 1425A, 1425B, and 1425C, which include the disclosed integrated interposer. It will be recognized that any device containing an IC may also include the disclosed integrated interposer, including the base stations, switching devices, and network equipment. FIG. 14 shows forward link signals 1480 from the base station 1440 to the remote units 1420, 1430, and 1450 and reverse link signals 1490 from the remote units 1420, 1430, and 1450 to base stations 1440.

In FIG. 14, remote unit 1420 is shown as a mobile telephone, remote unit 1430 is shown as a portable computer, and remote unit 1450 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 14 illustrates IC devices 1425A, 1425B, and 1425C, which include the disclosed integrated interposer, the disclosure is not limited to these exemplary illustrated units. Aspects of the present disclosure may be suitably employed in any device, which includes an interposer.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated interposer, comprising:
    an interposer substrate including at least a first portion of a 3D passive device within an active region of the interposer substrate;
    an inter-conductive dielectric layer on an active surface of the active region of the interposer substrate, the inter-conductive dielectric layer including at least a second portion of the 3D passive device on a surface of the inter-conductive dielectric layer;
    a contact layer coupled to the 3D passive device and configured to couple at least one die to the integrated interposer;
    at least one through via coupled to the contact layer and extending through the interposer substrate to a passive surface of the interposer substrate; and
    an interconnect layer on the passive surface of the interposer substrate and coupled to the at least one through via.

2. The integrated interposer of claim 1, further comprising a 3D substrate tap integrated into the active region of the interposer substrate to enable access to the first portion of the 3D passive device.

3. The integrated interposer of claim 1, in which the first and second portions of the 3D passive device comprise a trench capacitor structure.

4. The integrated interposer of claim 3, in which at least one plate of the trench capacitor structure comprises a via extending through the interposer substrate to an isolation layer on the passive surface of the interposer substrate.

5. The integrated interposer of claim 1, further comprising a plurality of interconnects to couple the at least one die to the contact layer of the integrated interposer.

6. The integrated interposer of claim 1, further comprising a plurality of diodes on another active surface of another active region of the interposer substrate.

7. The integrated interposer of claim 6, in which the plurality of diodes are arranged with the 3D passive device to provide electrostatic discharge (ESD) protection for the at least one die.

8. The integrated interposer of claim 1, further comprising a plurality of interconnects to couple the at least one die to the contact layer of the integrated interposer.

9. The integrated interposer of claim 1, in which the interconnect layer comprises a redistribution layer, the integrated interposer further comprising a plurality of interconnects to couple a system board to the integrated interposer.

10. The integrated interposer of claim 1 integrated into a mobile phone, a set top box, a music player, a video player, an entertainment unit, a navigation device, a computer, a handheld personal communication systems (PCS) unit, a portable data unit, and/or a fixed location data unit.

11. An integrated interposer, comprising:
    an interposer substrate including at least a first portion of a 3D passive device within an active region of the interposer substrate;
    an inter-conductive dielectric layer on an active surface of the active region of the interposer substrate, the inter-conductive dielectric layer including at least a second portion of the 3D passive device on a surface of the inter-conductive dielectric layer;
    a contact layer coupled to the 3D passive device and configured to couple at least one die to the integrated interposer;
    an interconnect layer on a passive surface of the interposer substrate; and
    means for coupling the contact layer through the interposer substrate to the interconnect layer on the passive surface of the interposer substrate.

12. The integrated interposer of claim 11, further comprising a substrate tap integrated into the active region of the interposer substrate of the integrated interposer to enable access to the first portion of the 3D passive device.

13. The integrated interposer of claim 11, in which the first and second portions of the 3D passive device comprise a trench capacitor structure, and in which at least one plate of the trench capacitor structure comprises a via extending through the interposer substrate to an isolation layer on the passive surface of the interposer substrate.

14. The integrated interposer of claim 11, further comprising a plurality of diodes on another active surface of another active region of the interposer substrate in which the plurality of diodes are arranged with the 3D passive device to provide electrostatic discharge (ESD) protection for the at least one die.

15. The integrated interposer of claim 11 integrated into a mobile phone, a set top box, a music player, a video player, an entertainment unit, a navigation device, a computer, a handheld personal communication systems (PCS) unit, a portable data unit, and/or a fixed location data unit.

16. A method of fabricating an integrated interposer, comprising:
    depositing an inter-conductive dielectric layer on an interposer substrate;
    fabricating at least a first portion of a 3D passive device within an active region of the interposer substrate;
    fabricating at least a second portion of the 3D passive device within the inter-conductive dielectric layer on an active surface of the active region of the interposer substrate;
    opening a contact layer to the first portion of the 3D passive device within the active region of the interposer substrate and to the second portion of the 3D passive device within the inter-conductive dielectric layer on the active surface of the interposer substrate;
    depositing a conductive material in at least one opening in the contact layer and at least one via opening on the active surface of the interposer substrate and extending through the interposer substrate to a passive surface of the interposer substrate to couple at least one die to the integrated interposer; and
    forming an interconnect layer on the passive surface of the interposer substrate and coupled to the contact layer through the conductive material in the least one via opening.

17. The method of claim 16, further comprising fabricating a plurality of diodes on another active surface of another active region of the interposer substrate, the plurality of diodes arranged with the 3D passive device to provide electrostatic discharge (ESD) protection for the at least one die.

18. The method of claim 16, further comprising:
- opening a plurality of trenches through the inter-conductive dielectric layer and in to the interposer substrate;
- doping a portion of the interposer substrate including the plurality of trenches to form the active region;
- depositing a dielectric film within the plurality of trenches and on the inter-conductive dielectric layer;
- patterning the dielectric film on the active surface of the interposer substrate; and
- depositing and etching the conductive material on the patterned dielectric film and within the plurality of trenches to provide the 3D passive device.

19. The method of claim 16, further comprising:
- etching the passive surface of the interposer substrate to thin the interposer substrate to a predetermined thickness to expose the at least one via opening; and
- filling the at least one opening in the contact layer and the at least one via opening with the conductive material to form the contact layer to the 3D passive device and a through via to couple the contact layer through the interposer substrate to the interconnect layer on the passive surface of the interposer substrate.

20. The method of claim 16, further comprising integrating the integrated interposer into a mobile phone, a set top box, a music player, a video player, an entertainment unit, a navigation device, a computer, a hand-held personal communication systems (PCS) unit, a portable data unit, and/or a fixed location data unit.

* * * * *